United States Patent
Brioschi

(10) Patent No.: US 8,157,890 B2
(45) Date of Patent: Apr. 17, 2012

(54) FILTER ASSEMBLY

(75) Inventor: Roberto Brioschi, Borgoticino (IT)

(73) Assignee: Gianus S.p.A., Milan (IT)

( * ) Notice: Subject to any disclaimer, the term of this patent is extended or adjusted under 35 U.S.C. 154(b) by 452 days.

(21) Appl. No.: 11/908,405

(22) PCT Filed: Feb. 22, 2006

(86) PCT No.: PCT/IT2006/000096
§ 371 (c)(1),
(2), (4) Date: Sep. 11, 2007

(87) PCT Pub. No.: WO2006/097955
PCT Pub. Date: Sep. 21, 2006

(65) Prior Publication Data
US 2008/0245235 A1    Oct. 9, 2008

(30) Foreign Application Priority Data
Mar. 15, 2005   (IT) .............................. TO2005A0169

(51) Int. Cl.
*B01D 46/46* (2006.01)
(52) U.S. Cl. ................ 95/14; 95/23; 95/273; 96/420; 96/422; 96/372; 96/378; 55/338; 55/418; 55/410
(58) Field of Classification Search ............ 96/417, 96/397, 400, 413, 420, 421, 422, 424, 429, 96/378, 372; 95/12, 2, 14–19, 22–23, 273; 55/410, 418, 338
See application file for complete search history.

(56) References Cited

U.S. PATENT DOCUMENTS

| | | | | |
|---|---|---|---|---|
| 4,361,119 A * | 11/1982 | Endo et al. | ................ | 123/494 |
| 4,515,609 A * | 5/1985 | Cuvelier | ................ | 96/422 |
| 5,205,156 A * | 4/1993 | Asano et al. | ................ | 73/38 |
| 5,392,646 A * | 2/1995 | Yajima | ................ | 73/204.19 |
| 5,429,649 A * | 7/1995 | Robin | ................ | 96/405 |
| 5,431,599 A * | 7/1995 | Genco | ................ | 454/187 |
| 5,621,159 A * | 4/1997 | Brown et al. | ................ | 73/9 |
| 5,681,364 A | 10/1997 | Fortune | | |
| 6,050,774 A | 4/2000 | LeBaron | | |
| 6,064,310 A * | 5/2000 | Busak et al. | ................ | 340/588 |
| 6,074,448 A * | 6/2000 | Schulz et al. | ................ | 55/286 |
| 6,198,243 B1 * | 3/2001 | Ritmanich et al. | ................ | 318/466 |
| 6,217,639 B1 * | 4/2001 | Jackson | ................ | 96/134 |

(Continued)

FOREIGN PATENT DOCUMENTS

EP        0864348 A1    9/1998
(Continued)

OTHER PUBLICATIONS

International Search Report and Written Opinion from Parent PCT/IT2006/000096.

*Primary Examiner* — Duane Smith
*Assistant Examiner* — Thomas McKenzie
(74) *Attorney, Agent, or Firm* — David A. Farah; Sheldon Mak & Anderson

(57) ABSTRACT

An improved filter assembly (1) is disclosed, particularly for electric cabinets, comprising a filter cloth (5), a conveying sump (7) and a fan (9), equipped with at least one thermal-resistive sensor (11) placed next to at least one hole (13) obtained in the conveying sump (7).

12 Claims, 2 Drawing Sheets

U.S. PATENT DOCUMENTS

| | | | |
|---|---|---|---|
| 6,245,131 B1 * | 6/2001 | Rippelmeyer et al. | 96/18 |
| 7,537,646 B2 * | 5/2009 | Chen et al. | 96/6 |
| 7,867,324 B2 * | 1/2011 | Chen et al. | 96/6 |
| 2004/0055464 A1 * | 3/2004 | Lamprecht et al. | 95/23 |
| 2004/0250606 A1 * | 12/2004 | Buttgenbach et al. | 73/61.49 |
| 2004/0251344 A1 * | 12/2004 | Lutton et al. | 241/47 |
| 2006/0174560 A1 * | 8/2006 | Levine et al. | 52/200 |

FOREIGN PATENT DOCUMENTS

| | | |
|---|---|---|
| JP | 55082246 A | 9/1980 |

* cited by examiner

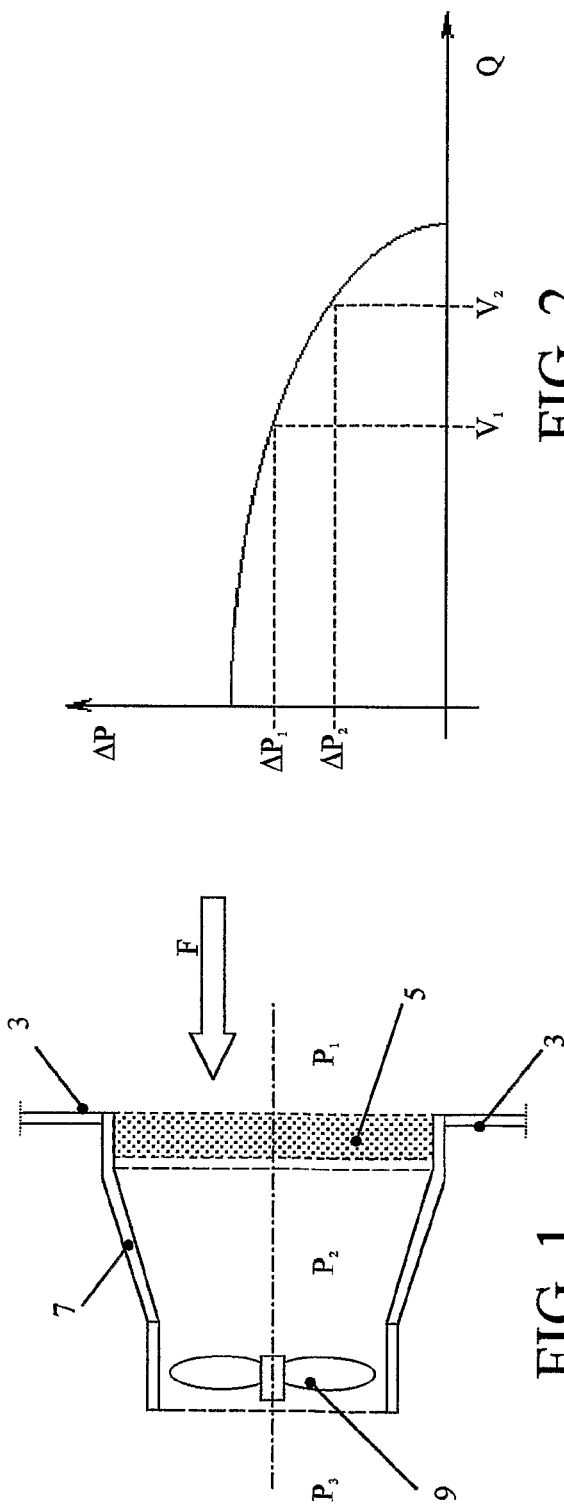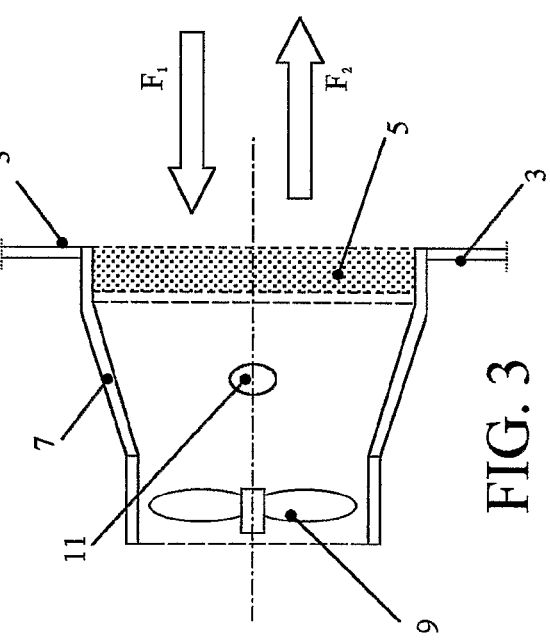

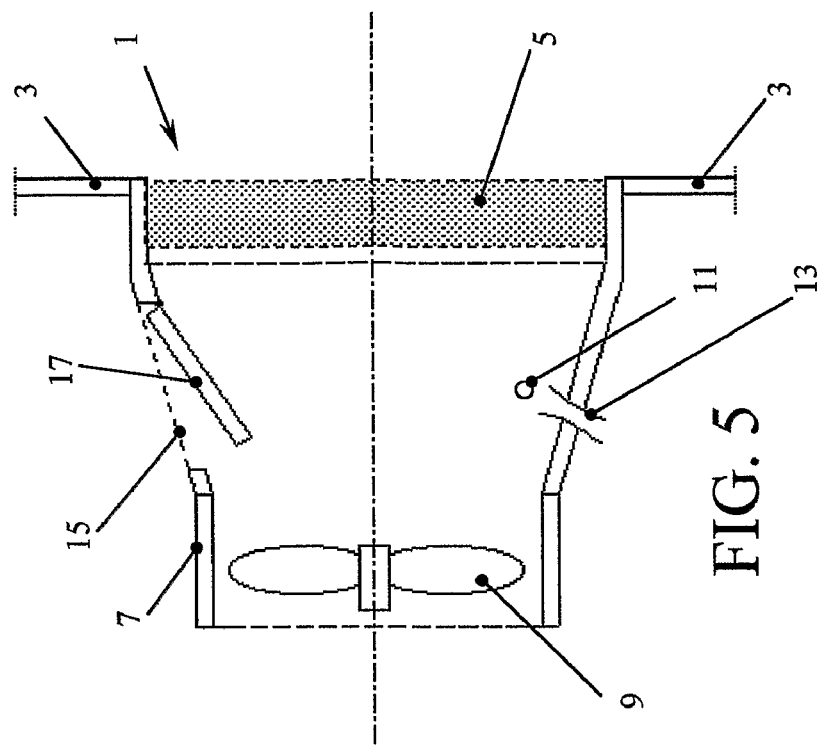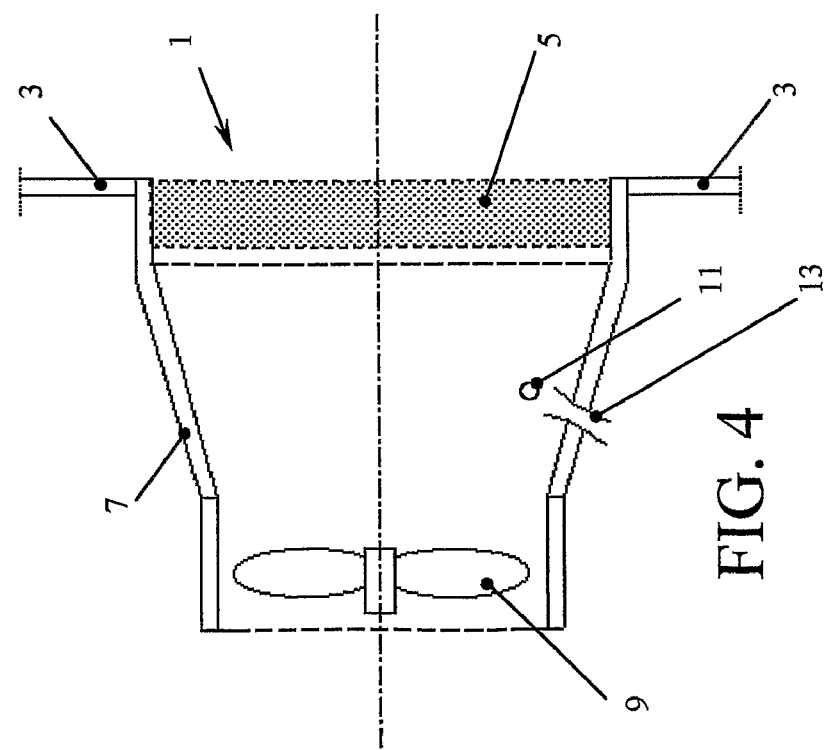

FILTER ASSEMBLY

CROSS-REFERENCE TO RELATED APPLICATION

The present Application is a 371 of International Patent Application No. PCT/IT2006/000096, titled "Filter Assembly," filed Feb. 22, 2006, which claims priority from Italian Patent Application No. TO2005A000169 filed Mar. 15, 2005, the contents of which are incorporated in this disclosure by reference in their entirety.

BACKGROUND OF THE INVENTION

1. Field of the Invention

The present invention refers to an improved filter assembly, particularly for electric cabinets.

2. Background Art

In the current art, in order to cool electric panels, air filtering systems are employed which are equipped with fans (of the axial, radial or the like type) adapted to force air through filter clothes adapted for filtering air.

In such known systems, the fan applied to the filter assembly must exceed the resistance to air crossing the filter, such resistance occurring with a load leakage, which increases the pressure that the fan must exceed with consequent decay of performance in terms of air flow-rate.

In particular, upon increasing the filter clogging, the further flow-rate decays cannot be computed by the user and often can drop (even quickly in case of very dirty atmospheres) under the minimum value, which guarantees an enough cooling of the device placed inside the electric cabinet.

A solution which has already been adopted in this case is providing a cabinet with a thermostat which is triggered upon reaching a limit temperature, but such thermostat will necessarily measure the temperature in a single spot, and with a reduce flow-rate a reduced internal venting (meant as air stirring inside the electric cabinet) is also associated, with consequent creation of dangerous and uncontrolled localised "hot spots".

Moreover, should venting be completely absent, but the external temperature be low enough, the relevant thermostat would not intervene at all, while "hot spots" would be at their maximum level.

For an optimum monitoring of temperature and venting inside the cabinet, it would be ideal to be able to monitor different alarm parameters and create better venting conditions.

The affected parameters are:
air flow-rate towards cabinet interior;
temperature inside the cabinet;
fan failures.

Fans of filters can be of the sucking or pressing type (namely can be both able to suck air inside the cabinet and able to pump out exhaust air) and it is extremely interesting that they operate indifferently along the two directions whichever type of sensor is used.

A further improvement with respect to the prior art would be to allow a higher venting inside the cabinet by short-circuiting permanently, or in case of need, part of the internal air.

SUMMARY OF THE INVENTION

Therefore, object of the present invention is solving the above prior art problems, by providing an improved filter assembly, particularly for electric cabinets, which is able to monitor, economically and reliably, several alarm parameters in order to guarantee an optimum monitoring of temperature and venting inside the cabinet itself.

Another object of the present invention is providing an improved filter assembly equipped with a sensor, which allows economically and reliably monitoring the air flow-rate towards the cabinet interior.

Another object of the present invention is providing an improved filter assembly, which is able to economically and reliably monitoring the temperature inside the electric cabinet and detect fan failures.

Moreover, an object of the present invention is providing an improved filter assembly equipped with sensors, which operate both as sucking fans and as pressing fans.

Another object of the present invention is providing an improved filter assembly equipped with an emergency system, which is able to allow a higher venting inside the cabinet by short-circuiting, permanently or in case of need, part of the internal air.

The above and other objects and advantages of the invention, as will appear from the following description, are reached with an improved filter assembly as described further in the specification. Preferred embodiments and non-trivial variations of the present invention are the subject matter of the dependent claims.

BRIEF DESCRIPTION OF THE DRAWINGS

The present invention will be better described by some preferred embodiments thereof, provided as a non-limiting example, with reference to the enclosed drawings, in which:

FIG. 1 shows a side sectional view of an embodiment of a filter assembly according to the prior art;

FIG. 2 shows a graph representing a fan operating characteristic;

FIG. 3 shows a side sectional view of an hypothetic embodiment of a filter assembly;

FIG. 4 shows a side sectional view of an embodiment of the improved filter assembly according to the present invention; and FIG. 5 shows a side sectional view of another embodiment of the improved filter assembly according to the present invention.

DETAILED DESCRIPTION OF PREFERRED EMBODIMENTS OF THE INVENTION

With reference to FIG. 1, it is possible to note a filter assembly for electric cabinets belonging to the prior art. Such filter assembly, inserted in a wall 3 of an electric cabinet, is composed, as known, proceeding from outside towards inside the cabinet along the air flow direction F, of a filter cloth 5, a conveying sump 7 and a fan 9; in such configuration, substantially three pressure ranges are defined: $P_1$ is the external pressure, $P_2$ (equal to $P_1$ minus the filter load leakage) is the intermediate pressure between filter cloth 5 and fan 9 and $P_3$ (equal to $P_2$ plus the fan 9 prevalence) is the internal head. As previously mentioned, it is clear that the fan 9 must exceed the air crossing resistance of the filter cloth 5, such resistance occurring with a load leakage which increases the pressure which the fan must exceed with following performance decay in terms of air flow-rate.

For measuring the air flow-rate, reference can be made to two different operating modes; in a first case, the flow-rate would be directly measured through helix sensors, Venturi meters or the like, but in this case, in addition to high costs, there would be an excessive filter assembly encumbrance (space is a precious item inside electric panels), since these devices always need wide overall spaces in order to have the flow in a laminar mode. In a second case, a flow-rate related parameter would have to be measured, and with reference with calibration tables of the assembly it would be necessary to compute the flow-rate itself.

Moreover, if it were possible to use the same sensor to measure parameters pertaining to other relevant quantities, this would be as well advantageous, since it would allow further economic savings.

In the present invention, the used flow-rate sensor exploits a systematic error which is typical of temperature measures with thermal-resistive sensors or thermal resistances, which is the self-heating.

The operating principle is as follows: a thermal resistance or a thermal-resistive sensor changes its internal resistance when the temperature, at which it operates, changes. It is possible to compute thereby its temperature by measuring this resistive value with an external ohmmeter. In order to be able to carry out the measure, it is however necessary to make a current pass through the sensor and to measure the resistance that it opposes against its crossing, the fact that a current passes through it automatically heats it according to the famous Joule law ($W=RI^2$).

Unfortunately, if a temperature has actually to be measured, this effect disturbs and becomes as severe as high the accuracy to be reached is.

And more, due to the Pauli indetermination principle, according to which the more accurately the position of a particle (or in this case a temperature value) is known, the worse its speed (in this case the difference between its internal value and the real air value) is known and vice versa, such effect cannot be remedied.

The improved filter assembly according to the present invention instead advantageously exploits this systematic error, by increasing it and obtaining from its variability all relevant information, as will be stated in the following description.

With reference in particular to FIG. 4, it is possible to note a preferred embodiment of the improved filter assembly 1 according to the present invention; such filter assembly 1, preferably inserted in the wall 3 of an electric cabinet, comprises, similarly to front filter assemblies, a filter cloth 5, a conveying sump 7 and a fan 9. The basic concept of the present invention however resides in placing a thermal-resistive sensor 11, such as preferably a resistance thermometer or a thermistor, so that it is crossed by an air flow depending on fan 9 flow-rate in such operating spot. As can be noted from FIG. 3, at first sight it would appear that the best place in which sensor 11 must be placed is downstream of the filter cloth 5, but this is a mistake, since in such area, the inlet air speed (flow $F_1$) is surely small or comparable with the one due to air turbulences caused by blade rotation and the result would be strongly impaired; moreover, in this case, if a reading performed for measuring the internal panel temperature had to be used, this could be done only in case the fan expels air from the panel (flow $F_2$) since in case the fan sucks air into the panel, the external air temperature would actually be measured.

The arrangement according to the present invention is therefore inserting at least one sensor 11 inside at least one small hole 13 preferably shaped as a Venturi (to guarantee a laminar flow), obtained inside the conveying sump 7 of the filter assembly 1, exploiting the fact that, next to such hole, there is always the pressure generated by the fan and the filter is always crossed by air coming from inside the electric cabinet.

The technique used for the measure is the known hot wire anemometer one. In practice, it is important that the sensor 11 has a small thermal capacity, so that with small powers (and therefore currents) a high self-heating effect is obtained (ex. 1° C./50 mW) in unmoving air.

It is clear that this self-heating changes when the cooling capacity of sensor 11 changes and this in turn is a linear function of the convective motion crossing it.

By measuring the sensor 11 temperature in different, but nearby times, nominally with dissipated power (value affected by the self-heating error) and computing a difference between the two quantities, a parameter is obtained which is directly related to air speed in hole 13. Air speed is a linear function of the pressure difference between the two sides of hole 13 (in case of laminar flow, and anyway monotone even in case of a turbulent motion) and the geometry of the hole 13, which generates the aerodynamic resistance.

Since the hole 13 geometry does not change, air speed crossing the sensor 11 is a direct function of pressure difference $\Delta P$ at fan 9 sides, by measuring which one can compute the actual fan power V depending on its operating characteristic. FIG. 2 shows as an example the graph of the hypothetic operating characteristic of fan 9, depending on flow-rate Q (measured in $m^3/h$) and pressure difference $\Delta P$ (measured in Pa), using which flow-rate values $V_1$ and $V_2$ have been obtained as an example, depending on respective measured pressure difference values $\Delta P_1$ e $\Delta P_2$. Obviously, the pressure measure can be carried out with membrane-type pressure sensors, but its cost would be higher by at least two orders of magnitude.

It is also possible to measure the quickness with which the stored heat is lost with a current pulse by simply measuring the temperature function derivatives in time, such thing being very easy to do with a normal operational component, in case the system has to be made with discrete electronics and not with microprocessors.

The system in this case (due to the effects overlapping principle) is also wholly independent from the absolute value of the electric cabinet temperature, this being also interesting (it must be recalled that, by deriving, a constant which is not interesting is lost, which in this case is the absolute temperature). The same result is obtained in case of a digital measure by differentiating the temperature function in a time interval, which is short enough.

It is also advantageous that the sensor 11 of the filter assembly 1 according to the present invention also operates as internal temperature meter, independently from the fact that the fan 9 is of the sucking or pressing type.

This combination of factors makes it possible to be able to use a single sensor 11 for measuring both the actual air flow which enters the electric cabinet, and the electric cabinet temperature, thereby making it possible to obtain three possible results with a single inexpensive sensor 11:

an alarm thermostat (not shown) which is able to generate alarms and/or to monitor the fan speed, thereby replacing a further component inside the panel;

a thermometer able to measure and display the panel temperature (it must be noted that, being the filter assembly partly outside the panel, it is possible to measure the temperature on external displaying means, such as a display (not shown) placed on the external filter surface without drilling other holes in the electric panel).

In both above aspects, a reading is more reliable than in a normal sensor placed inside the panel, since air is forced to continuously impact onto the sensor 11 itself, without allowing for the formation of layers of temperatures;

the air flow-rate measure, on which an alarm signal can also be placed, which can be seen from outside and that, in a limit case, physically intervenes on users inside the panel.

It is also possible, when the sensor 11 has a thermal inertia which is low enough, to measure ripples due to local speed variations when the fan 9 blades are passing, and thereby to verify that the fan 9 itself is rotating and at which speed, this being another parameter in which it is possible to introduce an alarm signal.

If, with particularly quick fans or with fans causing low turbulences, it is not possible to measure this parameter, it will be enough to adopt an optical reading device (photodiode) or a magnetic reading device (Hall-effect transistor) to provide for the measure of this parameter.

With respect to the current prior art, it is possible to introduce a further improvement to filter assemblies, such improvement being partly obtained already automatically due to the adoption of the above described flow-rate measuring system.

Often in case of filter cloth 5 clogging, air inside the cabinet remains unmoving and layered; in order to solve such problem, often a further fan is added in order to stir the internal air.

With reference to FIG. 5, it is possible to note that the conveying sump 7 of the filter assembly 1 can be equipped with suitable openings 15 through which it is possible to make internal air re-circulate, making in many cases superfluous to use a second internal homogenising fan, with the consequent cost savings.

These openings 15 could be occluded with a peelable ribbon or a removable plug, in order to be able to satisfy with a single product different use needs (the user decides upon installation to adopt the re-circulation option or not), or they can be automatically opened by a mechanical transducer (for example through a door 17 with spring and magnetic uncoupling) when, since the external flow-rate is too much reduced, it is decided that it is better to choose an internal emergency venting till the filter cloth 5 is replaced.

The filter assembly 1 according to the present invention optimally operates independently from the reason, which generates the flow-rate reduction, since the actual pressure is measured at fan 9 ends.

The flow-rate reduction, in fact, could be caused, in addition to filter clogging, also by an internal panel pressurisation due to assembling errors or from the starting of ambient air conditioners, if the panel has its sucking section placed outside and has its cable terminals in an underground recess which is subjected to the pressure head.

It must be observed that, moreover, the air re-circulating system has no malfunctions in case of flow-rate reductions due to internal overpressure, but that, instead, when these conditions change (the ambient air conditioner in the building is started or stopped, for example), it automatically changes function passing from an almost complete re-circulation to an almost complete suction with continuity.

The filter assembly 1 according to the present invention has been described so far as an example applied for venting electric cabinets, since this is its most typical industrial application, but it is clear that it can be used in any other field in which the same inventive characteristics are required, such as, for example, in monitoring the operation of suction hoods, without departing from the scope of the present invention as defined by the following claims.

The invention claimed is:

1. A filter assembly for electric cabinets, the filter assembly comprising a filter cloth, a conveying sump, a fan operating at a fan power and a flow-rate sensor;
wherein the conveying sump comprises a wall with a Venturi-shaped hole in the wall;
wherein the Venturi-shaped hole communicates with an interior of the electric cabinet;
wherein the conveying sump connects the filter cloth to the fan and is between the filter cloth and the fan;
wherein the flow-rate sensor is adjacent the Venturi-shaped hole in the conveying sump;
wherein the flow-rate sensor has a thermal capacity such that the flow-rate sensor is self-heating in unmoving air;
wherein the flow-rate sensor has a cooling capacity which changes as a function of air flow crossing the flow-rate sensor;
wherein the flow-rate sensor determines the temperature of the flow-rate sensor at multiple times;
wherein the difference between the temperatures of two of the multiple times is directly related to air speed in the hole;
wherein the air speed in the hole is a function of the fan power;
wherein the conveying sump is equipped with at least one opening for re-circulating internal air in the electric cabinet; and
wherein the opening is separate from the inlet, outlet or Venturi-shaped hole.

2. The filter assembly of claim 1, wherein the flow-rate sensor further measures the internal temperature of the electric cabinet.

3. The filter assembly of claim 1, wherein the fan comprises blades and wherein the flow-rate sensor also measures ripples due to blade speed changes of the fan.

4. The filter assembly of claim 1, wherein the filter assembly is equipped with an alarm signal adapted to signal anomalies in values of the air flow-rate crossing the filter assembly or the internal temperature of the electric cabinet or the rotation speed of the fan.

5. The filter assembly of claim 1, wherein the filter assembly is equipped with an alarm thermostat operatively connected to the flow-rate sensor.

6. The filter assembly of claim 1, wherein the filter assembly is equipped with means for displaying a value of the internal temperature.

7. The filter assembly of claim 1, wherein the filter assembly is equipped with an optical or magnetic reading device adapted to measure rotation speed variations of the blades of the fan.

8. The filter assembly of claim 1, wherein the opening is occluded by a peelable ribbon or a removable plug.

9. The filter assembly of claim 1, wherein the opening is equipped with an automatically opening door.

10. The filter assembly of claim 1, wherein the opening is equipped with a door that opens in steps.

11. A method of determining the fan power of a filter assembly for electric cabinets, comprising:
a) providing the filter assembly, the filter assembly comprising a filter cloth, a conveying sump, a fan operating at a fan power and a flow-rate sensor;
wherein the conveying sump comprises a wall with a Venturi-shaped hole in the wall;
wherein the Venturi-shaped hole communicates with an interior of the electric cabinet;
wherein the conveying sump connects the filter cloth to the fan and is between the filter cloth and the fan;
wherein the flow-rate sensor is adjacent the Venturi-shaped hole in the conveying sump;
wherein the flow-rate sensor has a thermal capacity such that the flow-rate sensor is self-heating in unmoving air;

wherein the flow-rate sensor has a cooling capacity which changes as a function of air flow crossing the flow-rate sensor;

wherein the flow-rate sensor determines the temperature of the flow-rate sensor at multiple times;

wherein the difference between the temperatures of two of the multiple times is directly related to air speed in the hole;

wherein the air speed in the hole is a function of the fan power;

wherein the conveying sump is equipped with at least one opening for re-circulating internal air in the electric cabinet; and wherein the opening is separate from the inlet, outlet or Venturi-shaped hole;

b) allowing the flow-rate sensor to measure the temperature of the flow-rate sensor at multiple times wherein the difference between the temperatures of two of the multiple times is directly related to air speed in the hole; and wherein the air speed in the hole is a function of the fan power; and c) computing the fan power.

12. A method of determining the fan power of a filter assembly for electric cabinets comprising:

a) providing a filter assembly comprising:
  i) a first end of the filter assembly and a second end of the filter assembly;
  ii) a wall between the first end of the filter assembly and the second end of the filter assembly, the wall defining a conveying sump,
    wherein the first end of the filter assembly, the second end of the filter assembly and the conveying sump define an interior space of the filter assembly, the interior space comprising an interior temperature, and
    wherein first end of the filter assembly, the second end of the filter assembly and the conveying sump separate the interior space of the filter assembly from space exterior to the filter assembly;
  iii) a filter cloth at the first end of the filter assembly;
  iv) a fan at the second end of the filter assembly, the fan operating at a fan power;
  v) a Venturi-shaped hole in the wall defining the conveying sump,
    wherein the Venturi-shaped hole comprises a first end and a second end,
    wherein the Venturi-shaped hole is between the first end of the filter assembly and the second end of the filter assembly, and
    wherein the first end of the Venturi-shaped hole opens directly into the space exterior to the filter assembly and the second end of the Venturi-shaped hole opens directly into the interior space of the filter assembly, and
    wherein the Venturi-shaped hole allows air to pass from the space exterior of the filter assembly to the interior space of the filter assembly;
    wherein the conveying sump is equipped with at least one opening for re-circulating internal air in the electric cabinet;
    wherein the opening is separate from the inlet, outlet or Venturi-shaped hole;
  vi) a flow-rate sensor within the interior space of the filter assembly near the wall and adjacent the Venturi-shaped hole in the wall between the first end of the filter assembly and the second end of the filter assembly;

b) allowing the flow-rate sensor to measure the temperature of the flow-rate sensor at three or more than times wherein the difference between the temperatures of two successive times is directly related to air speed in the hole; and wherein the air speed in the hole is a function of the fan power; and c) computing the fan power.

* * * * *